United States Patent
Yudasaka

(10) Patent No.: US 7,288,792 B2
(45) Date of Patent: Oct. 30, 2007

(54) METHOD OF MANUFACTURING SEMICONDUCTOR DEVICE, METHOD OF MANUFACTURING ELECTRONIC APPARATUS, SEMICONDUCTOR DEVICE, AND ELECTRONIC APPARATUS

(75) Inventor: Ichio Yudasaka, Chino (JP)

(73) Assignee: Seiko Epson Corporation, Tokyo (JP)

( * ) Notice: Subject to any disclaimer, the term of this patent is extended or adjusted under 35 U.S.C. 154(b) by 209 days.

(21) Appl. No.: 11/061,442

(22) Filed: Feb. 22, 2005

(65) Prior Publication Data
US 2005/0184293 A1    Aug. 25, 2005

(30) Foreign Application Priority Data
Feb. 23, 2004    (JP)    .............................. 2004-046154

(51) Int. Cl.
*H01L 29/04* (2006.01)
*H01L 31/20* (2006.01)
(52) U.S. Cl. .................. 257/72; 257/59; 257/758; 257/774; 257/775; 257/E29.314
(58) Field of Classification Search ................. 257/59, 257/72, E29.314, 758, 774, 775
See application file for complete search history.

(56) References Cited

U.S. PATENT DOCUMENTS

| | | | | |
|---|---|---|---|---|
| 6,124,604 | A * | 9/2000 | Koyama et al. | 257/72 |
| 6,927,809 | B2 * | 8/2005 | Gotoh et al. | 349/44 |
| 2001/0019130 | A1 * | 9/2001 | Yamazaki et al. | 257/72 |
| 2003/0134519 | A1 * | 7/2003 | Yudasaka et al. | 438/758 |

FOREIGN PATENT DOCUMENTS

JP    A 5-150264    6/1993

* cited by examiner

*Primary Examiner*—Jerome Jackson
*Assistant Examiner*—Joseph Nguyen
(74) *Attorney, Agent, or Firm*—Oliff & Berridge, PLC

(57) ABSTRACT

Exemplary embodiments of the present invention are intended to provide a semiconductor device that can readily address or achieve high integration. Exemplary embodiments provide a semiconductor device constructed to include a transistor and a multi-layer wiring structure electrically connected to the transistor, the multi-layer wiring structure having a first wiring layer disposed in the same layer as the semiconductor layer of the transistor.

12 Claims, 4 Drawing Sheets

METHOD OF MANUFACTURING SEMICONDUCTOR DEVICE, METHOD OF MANUFACTURING ELECTRONIC APPARATUS, SEMICONDUCTOR DEVICE, AND ELECTRONIC APPARATUS

BACKGROUND

Exemplary embodiments of the present invention relate to a method of manufacturing a semiconductor device, a method of manufacturing an electronic apparatus, a semiconductor device, and an electronic apparatus.

As disclosed in related art document Japanese Unexamined Patent Publication No. Hei 5-150264, multi-layer interconnection structures are adopted to attempt to attain high integration of semiconductor devices and other electronic devices. For example, in an active matrix type liquid crystal display, one such electronic devices, a semiconductor layer, a gate wiring layer, a source wiring layer, and a drain wiring layer of a transistor are deposited with an insulation film therebetween on a glass substrate. Further, an intermediate electrode or the like is disposed between the semiconductor layer and either the source wiring layer or the drain wiring layer as necessary. Connections among the layers are made through contact holes.

SUMMARY

The above-described electronic devices will have increasing demand for higher performance. Further, their elements and wiring will be demanded to become finer and denser. However, excessively fine elements and wiring need the wiring area larger than a certain amount of area to be secured because of the possibility of causing problems such as disconnection.

Exemplary embodiments of the present invention address this situation. Exemplary embodiments further provide a semiconductor device, a method of manufacture thereof, and an electronic apparatus that can readily address or achieve high integration.

To address or solve the above discussed and/or other problems, a semiconductor device of exemplary embodiments of the present invention includes a transistor and a multi-layer interconnection structure electrically connected to the transistor, the multi-layer interconnection structure having a first wiring layer disposed in the same layer as a semiconductor layer of the transistor.

In order to secure enough wiring region, exemplary embodiments of the present invention expand a region to form the multi-layer interconnection up to the layer (the first-formed layer) used in the related art only to form a semiconductor layer of a transistor. Thus, in exemplary embodiments of the present invention, forming the necessary wiring on the first-formed layer can substantially reduce the wiring density of the layer that is formed on or above the first-formed layer, which allows higher integration to be readily addressed or achieved if it becomes necessary.

In the semiconductor device of exemplary embodiments of the present invention, the multi-layer interconnection structure has the first wiring layer disposed in the same layer as the semiconductor layer of the transistor, a second wiring layer disposed in the same layer as a gate wiring layer of the transistor, and a third wiring layer deposited on the second wiring layer with an insulation film therebetween, with the first, second, and third wiring layers electrically connected. Providing a plurality of wiring layers in this manner allows various routes along which signals are taken out from the transistor, thereby enhancing flexibility of wiring design. The first and second wiring layers are disposed on the same layers as the semiconductor layer and gate wiring layer of the transistor, respectively. Accordingly, there is an advantage that collectively forming the first and second wiring layers together with the semiconductor layer and gate wiring layer, respectively, simplifies the manufacturing process.

In the semiconductor device of exemplary embodiments of the present invention, the plurality of multi-layer interconnection structures may also be provided for one transistor, which allows more various routes along which signals are taken out.

In the semiconductor device of exemplary embodiments of the present invention, the first wiring layer may also be electrically connected to the semiconductor layer of the transistor. Specifically, the first wiring layer may be partially deposited on the surface of the semiconductor layer to be electrically connected to the semiconductor layer. Connecting the first wiring layer and semiconductor layer directly in this manner instead of via the layer formed on or above the first-formed layer, can reduce the wiring density of the layer formed on or above the first-formed layer.

The method of manufacturing the semiconductor device of exemplary embodiments of the present invention is one of manufacturing a semiconductor device that has a transistor and a multi-layer interconnection structure electrically connected to the transistor. The method includes a process to form a semiconductor layer of the transistor and a first wiring layer of the multi-layer interconnection structure on the same layer of a substrate.

In this manner, partially utilizing the layer (the first-formed layer) that is used in the related art only to form the semiconductor layer so as to form a wiring layer makes it possible to address or achieve high integration without excessively fine and dense wiring.

In the method of manufacturing the semiconductor device of exemplary embodiments of the present invention, the semiconductor layer and the first wiring layer may also be collectively formed by the same patterning of a semiconductor film, thereby making the manufacturing process simple.

In the method of manufacturing the semiconductor device of exemplary embodiments of the present invention, the first wiring layer may be composed of a material that has higher conductivity than that of the semiconductor layer. Forming the first wiring layer to be composed of a different material from that of the semiconductor layer can address or achieve a multi-layer interconnection structure with low resistance.

The method of manufacturing the semiconductor device of exemplary embodiments of the present invention may also include a process to form an insulation film on the semiconductor layer and the first wiring layer, and a process to collectively form a gate wiring layer of the transistor and a second wiring layer of the multi-layer interconnection structure on the insulation film by the use of the same conductive material. The second wiring layer can thereby be formed without the addition of a new process. Incidentally, as methods to form the gate wiring layer and second wiring layer, there may be a method of collectively forming them by patterning a conductive film formed on the insulation film, and a method of continuously drawing them by a droplet discharging method.

The method of manufacturing the semiconductor device of exemplary embodiments of the present invention may also include a process to form an insulation film on the gate wiring layer and the second wiring layer, and a process for collectively forming a source wiring layer or a drain wiring layer of the transistor and a third wiring layer of the multi-layer interconnection structure on the insulation film by the use of the same conductive material. The third wiring layer can thereby be formed without the addition of a new process. Incidentally, as methods to form the source wiring layer (or the drain wiring layer) and third wiring layer, there may be a method of collectively forming them by patterning a conductive film formed on the insulation film, and a method of continuously drawing them by a droplet discharging method.

In the method of manufacturing the semiconductor device of exemplary embodiments of the present invention, the insulation film may be formed by a liquid phase method. In the case of using a liquid phase process, as just described, the surface of the insulation film is planarized, which results in reducing the occurrence of disconnection or the like in the wiring formed on the insulation film. If such a planarized film is utilized as the gate insulation film, there are advantages that a leakage current flowing through the gate insulation film is reduced and that a breakdown voltage of the transistor is enhanced.

This method may include a process to form contact holes (openings) through which upper and lower layers are connected to each other. In this case, a process to form the wiring layer may be one for patterning the conductive material by utilizing as alignment marks the concavo-convex form of the surface of the conductive material caused by the contact holes. As described above, in the liquid phase process, planarization of the film surface allows manufacturing of high performance devices. On the other hand, however, planarization of the film surface may bring a disadvantage to the process of manufacturing the device. That is, when a thin film is formed by the liquid phase process (such as a spin coating method), the concavity and convexity of a pattern disposed under the thin film are planarized by the thin film. Even though forming and patterning a film that does not transmit light is attempted, aligning at the sight of concavity and convexity of the film surface in the photolithography process cannot be performed as before. For example, when a gate insulation film or an interlayer insulation film of the transistor is formed by the liquid phase process, the surface of a metal film for wiring formed on the insulation film is a planarized surface without concavity and convexity, which results in precluding a precise location of the metal film with respect to the semiconductor layer and the wiring layer under the metal film. In contrast, this method utilizes as an alignment mark the concavity and convexity caused by opening a hole in the insulation film, and therefore the foregoing problem does not occur. This method also performs the process of opening a hole in the insulation film as a part of the process to form a contact hole, and therefore a new process is not added and an area to form an alignment mark need not be specially secured on the substrate.

In this method, the process to form a contact hole may include a process to form a mask material at the location where the contact hole is formed, a process to form the insulation film on the whole surface excluding the mask material of the substrate, and a process to remove the mask material. In this method, the mask material that has already been formed on the substrate before forming the insulation film is removed after forming the insulation film, thereby forming an insulation film non-formation region (a contact hole), in which an insulation film is not formed, at the location where the semiconductor film is formed. The method involves little damage on the substrate as compared with the case of forming a contact hole in the insulation film by etching. The method can also form a contact hole precisely at the location where the semiconductor film is formed even if the insulation film is composed of an opaque material.

Incidentally, in this method, the following is considered as specific exemplary aspects of the process to form a mask material.

1. The process to form a mask material includes a process to form a photosensitive material on the whole substrate of the substrate, and a process to apply exposure and development to the photosensitive material to form a mask material composed of the photosensitive material at the location where the contact hole is formed.

2. The process to form a mask material includes a process to selectively drop a liquid material including the mask material by a droplet discharging method onto the location where the contact hole is formed.

An electronic apparatus of exemplary embodiments of the present invention includes the above-described semiconductor device, which makes it possible to provide a high performance electronic apparatus.

DETAILED DESCRIPTION OF PREFERRED EMBODIMENTS

First Exemplary Embodiment

Figure 1A:
FIGS. 1A-E are schematic process diagrams showing an example of a method of manufacturing a transistor.

An exemplary embodiment of the present invention will now be described below with reference to the drawings. FIGS. 1 to 3 are process diagrams to explain a method of manufacturing a semiconductor device of exemplary embodiments of the present invention and are schematic sectional diagrammatic views that show only a region (an element area) in which a transistor (TFT) and a multi-layer interconnection structure are formed on an enlarged scale. Incidentally, in every drawing described below, the film thickness, dimension, etc., of components have different scales from each other in order to make the drawing more recognizable.

(Semiconductor Film Formation Process)

Initially, a substrate 10 for manufacturing a TFT is prepared. Other than quartz substrates, glass substrates, and insulation substrates composed of heat-resistant plastics or the like, semiconductor substrates composed of silicon wafers or the like and conductive substrates composed of stainless steal or the like can be used as the substrate 10. In order to reduce or prevent a movable ion such as natrium included in the substrate from being mixed into the below-described semiconductor film, a substrate protective film composed of an insulation substance such as a silicon oxide film, a silicon nitride film, and a silicon oxynitride film may be formed on the surface of the substrate 10 as necessary.

A semiconductor film for forming a TFT active layer is then formed on the substrate 10. Although an amorphous silicon film is used as the semiconductor film in this example, other semiconductor materials such as germanium may be used. There may also be a semiconductor film composed of a complex of group four elements such as silicon and germanium, silicon and carbide, germanium and carbide, etc., a semiconductor film composed of a complex compound of a group three element and a group five element such as gallium and arsenic, indium and antimony, etc., and a semiconductor film composed of a complex compound of a group two element and a group six element such as cadmium and selenium, etc. There may further be a complex compound semiconductor film with the use of silicon, germanium, gallium, arsenic, etc., and an n-type semiconductor film made by adding a donor element such as phosphorus (P), arsenic (A), antimony (Sb), etc., to these semiconductor films or a p-type semiconductor film made by adding an acceptor element such as boron, aluminum (Al), gallium (Ga), indium (In) etc., to these semiconductor films.

Such semiconductor films can be formed either by CVD methods such as a APCVD method, a LPCVD method, and a PECVD method, or by PVD methods such as a sputter method and a deposition method.

(Semiconductor Film Crystallization Process)

The deposited semiconductor film is then crystallized. The term "crystallize" used here means providing an amorphous semiconductor film with thermal energy to change the amorphous semiconductor film to a polycrystal or single crystal semiconductor film. The term "crystallize" also means providing a semiconductor film composed of a fine crystal film or a polycrystal film with thermal energy to enhance the film properties of the crystal film and recrystallize the semiconductor film by melting and solidifying. In this specification, the term "crystallize" is not limited to crystallizing amorphous, but includes crystallizing polycrystal and fine crystal.

The process for crystallizing a semiconductor film can be performed by the method with the use of laser irradiation, a rapid thermal method (such as a lamp annealing method and a thermal annealing method), and the method with the use of solid phase growth. However, this process is not limited to these methods. In this example, laser annealing crystallizes the amorphous semiconductor film to change the amorphous semiconductor film to the polycrystal semiconductor film (such as a polysilicon film). At this point, an excimer laser, an argon ion laser, the second or third harmonic of a YAG laser, which have the wavelength in and near the ultraviolet region, are preferable as a laser beam. For example, with the excimer laser, a line beam with the length of 400 mm is used and its output intensity should be 400 mJ/cm$^2$. It is desirable that the semiconductor film is scanned with the line beam such that, in the scanned area, the portions corresponding to 90% of the peak value of laser intensity in the direction of the short side of the line beam overlap each other.

(Element Isolation Process)

Element isolation is performed so as to define the region of the TFT. Although this example uses etching for element isolation, a LOCOS method, a field shield method, a STI method or the like may be used as an element isolation technique. By the element isolation process, a polycrystal semiconductor film (a semiconductor layer that becomes an active layer of the TFT) 11 with a certain form as shown in FIG. 1A is formed on the substrate 10.

Figure 1B:
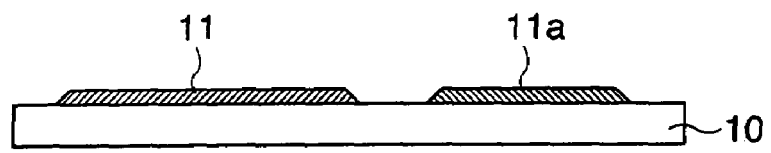

As shown in FIG. 1B, a first wiring layer 11a is formed in the region in which the TFT is formed, that is, near the semiconductor film 11. The first wiring layer 11a constitutes a portion of multi-layer interconnection structure that is electrically connected to the TFT related to the semiconductor film 11 for taking out electric signals from the TFT.

A conductive film is made from a material with higher conductivity than that of the semiconductor film 11, such as aluminum, on the whole surface of the substrate, for example, by sputtering and then patterned. The first wiring layer 11a can thereby be formed. The first wiring layer 11a may be formed by selectively providing a liquid material that has a high conductivity material dissolved or dispersed in the solvent (liquid material including a conductive material) in the predetermined regions by using a droplet discharging method and then drying and baking the provided liquid material. In the above-described element isolation process, the semiconductor film, which becomes the first wiring layer 11a, may be made to be conductive by collectively pattering the semiconductor film together with the semiconductor film 11 and implanting an impurity ion to the patterned semiconductor film.

Incidentally, in this example, a structure in which the first wiring layer 11a is electrically connected to the semiconductor film 11 is adopted. For example, if the first wiring layer 11a is formed with a different material from the semiconductor film 11, the first wiring layer 11a is formed so as to be partially deposited on the surface of the semiconductor film 11. If the first wiring layer 11a and semiconductor film 11 are collectively formed by the same patterning of the semiconductor films, the semiconductor film on the first wiring layer 11a is formed such that the semiconductor film 11, which becomes an active layer of the TFT, is pulled to the region in which the wiring layer is formed.

(Mask Material Formation Process)

Figure 1C:
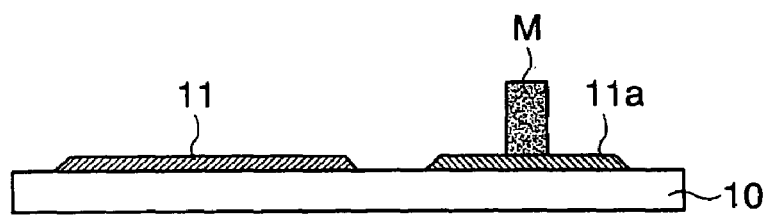

On the semiconductor film 11 and the first wiring layer 11a, a gate insulation film having an opening (a contact hole) on the first wiring layer is formed. Initially, as shown in FIG. 1C, a columnar mask pillar (a mask material) M is formed on the surface of the semiconductor film 11. The mask pillar M is provided for forming an opening (a contact hole) H1 that leads to the first wiring layer 11a in the below-described gate insulation film 12. In this example, a gate wiring layer and a conductive film that becomes a second wiring layer are formed in the opening and the concavo-convex form on the surface of the conductive film caused by the opening, is also utilized as an alignment mark, thereby enabling alignment between the conductive film and the semiconductor film 11 formed at the side of the lower layer.

The mask pillar M can be formed by performing exposure, development, baking and other processing operations after a photosensitive material such as a resist, is applied to the whole surface of the substrate. The mask pillar M can also be formed by selectively dropping a liquid material including an insulation material, onto the location where the opening H1 is formed by a droplet discharging method, and then drying and baking the dropped liquid material.

At this point, the thickness (height) of the mask pillar M should be equal to or greater than that of the gate insulation film 12 that will be formed later. As a result, the mask pillar M can be reduced or prevented from being buried in the gate insulation film 12 (that is, the upper portion of the mask pillar M projects from the surface of the gate insulation film 12).

The mask pillar M can be hardened as necessary. The hardening of the mask pillar M is performed as follows. The substrate 10 on which the mask pillar M is formed is carried in a vacuum chamber, which is not shown, and the inside of the vacuum chamber is depressurized to 1.3 kPa (10 Torr) or less, for example, around 0.2 Torr. The mask pillar M is then heated to a predetermined temperature of 100 to 150 degrees Celsius (for example, 130 degrees Celsius), which is the temperature of post baking of a normal photoresist, and is irradiated with ultraviolet light (for example, ultraviolet light with the wavelength of 254 nm) for several minutes. As a result, moisture dissolved in the mask pillar M is removed from the mask pillar M, and the ultraviolet light facilitates a cross-linking reaction of the mask pillar M. Additionally, because the mask pillar M is not affected by oxygen and moisture, the cross-linking reaction of the mask pillar M makes progress. Accordingly, the mask pillar M becomes dense and its heat resistance and medicine resistance are enhanced.

Hardening of the mask pillar M may be performed as necessary by heat treatment. Namely, the mask pillar M may be heated over the temperature of post baking. The heat treatment is performed, for example, at the temperature of 300 to 450 degrees Celsius for around 10 minutes. As a result, the mask pillar can be formed to have excellent heat resistance and medicine resistance, thereby enabling the use of a variety of liquid deposition materials. Incidentally, the atmosphere of ultraviolet light irradiation may be, for example, the atmosphere in which oxygen and moisture do not substantially exist (such as nitrogen atmosphere) other than a depressurized state.

In this example, the above-described hardening is performed for the mask pillar M so that the below-described pre-baking and main baking of a polysilazane gate insulation film can be sequentially performed.

(Gate Insulation Film Formation Process)

Figure 1D:
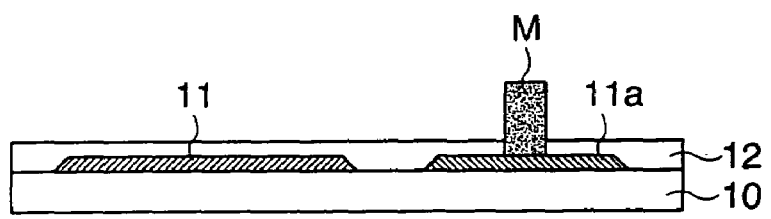

As shown in FIG. 1D, the gate insulation film 12 composed of silicon oxide or the like is formed around the mask pillar M, that is, the whole surface excluding the mask pillar M of the substrate by the use of a liquid phase method. First, a liquid for application in which polysilazane is mixed in xylen (a liquid material including polysilazane) is applied onto the substrate by spin coating and pre-baked at the temperature of 100 to 150 degrees Celsius for 5 minutes. Subsequently, heat treatment is performed in the atmosphere of WET $O_2$ at the temperature of 350 degrees Celsius for 60 minutes (main baking). Performing heat treatment in the atmosphere of WET $O_2$ in this way reduces the nitrogen component, which causes polarization, in the insulation film. In this process, it is not necessary to remove the mask pillar M when performing main baking of polysilazane because the heat resistance of the mask pillar M has already been enhanced in the previous process. Hence, the polysilazane gate insulation film can be provided with a consistent heat treatment (pre-baking and main baking), thereby making the process easy.

Incidentally, in this process, it is desirable to provide beforehand the mask pillar M with a liquid repellent treatment before applying a liquid material so as to reduce or prevent the liquid material from being attached to the upper portion of the mask pillar M. The liquid repellent treatment provided to the mask pillar M can be performed by decomposing a gas including fluorine atom such as carbon tetrafluoride, by means of atmospheric plasma to generate active monatomic fluorine and ion and exposing the mask pillar to the active fluorine. However, if the mask pillar M is formed with a photoresist with liquid repellence, such a liquid repellent treatment is unnecessary.

The above is the processes in which the gate insulation film 12 is formed.

Although a spin coating method is used as the method of application of a liquid material in this example, methods in the related art, such as a dip coating method, a roll coating method, a curtain coating method, a spray method, a droplet discharging method (ink-jet method) can also be used. Polyimide, Low-K material or the like distributed or dissolved in the predetermined solvent such as xylen can be used as the above-described liquid material.

Cleaning process can be provided between the process to form the semiconductor film and the process for forming the gate insulation film, as necessary. Specifically, when the patterning of the semiconductor film 11 finishes, the substrate is irradiated in the atmosphere of a gas including oxygen with ultraviolet light to discompose and remove contamination (such as an organic matter) existing on the surface of the substrate. A low-pressure mercury lamp having peak intensity at the wavelength of 254 nm and an excimer lamp having peak intensity at the wavelength of 172 nm are used here for irradiation with ultraviolet light. With the light in this wavelength region, oxygen molecule ($O_2$) decomposes into ozone ($O_3$), and further into oxygen radical ($O^*$). The utilization of the highly active ozone and oxygen radical generated here makes it possible to effectively remove the organic matter attached to the surface of the substrate.

(Mask Material Removal Process)

Figure 1E:
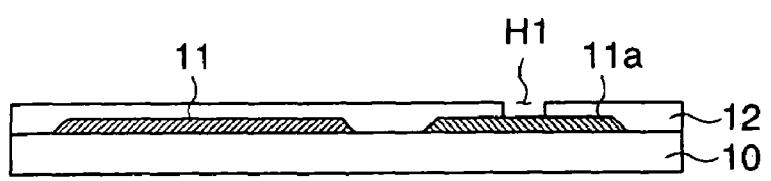

As shown in FIG. 1E, the mask pillar M is removed by the use of a remover (such as hot concentrated sulfuric acid). The opening H1 that leads to the first wiring layer 11a is thereby formed in the gate insulation film 12.

Incidentally, although the above-described method by the use of the mask pillar M is employed to form the opening H1 in this example, the opening H1 may be formed by using the normal photoetching process.

(Gate Wiring Formation Process)

Figure 2A:
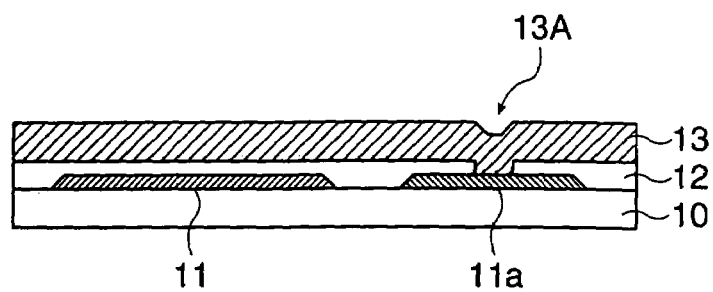
FIGS. 2A-D are process diagrams subsequent to FIG. 1.

As shown in FIG. 2A, a film 13 that covers the surface of the gate insulation film 12 and the inside of the opening H1 is formed on the gate insulation film 12. The gate wiring film 13 is formed by selecting an appropriate method such as a sputter method, a CVD method, and a deposition method, and stacking or depositing an appropriate metal such as tantalum, aluminum, titanium, etc., metallic nitride, and polysilicon on a thick film (for example, the thickness of around 300 to 500 nm). In this process, the opaque gate wiring film 13 is formed on the whole surface of the substrate; a concavo-convex portion 13A reflecting the concavo-convex form caused by the opening H1 is formed on the surface of the gate wiring film 13, because the opening H1 that leads to the semiconductor film 11 is formed in the gate insulation film 12 as described above.

Figure 2B:
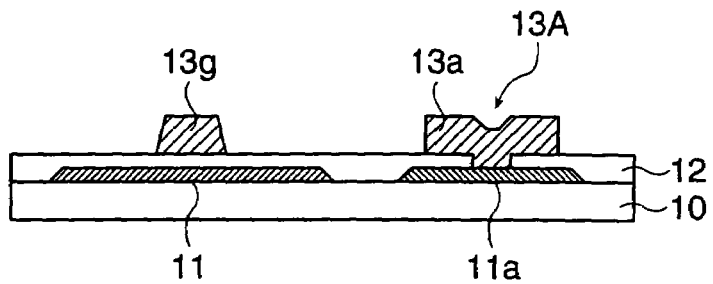

As shown in FIG. 2B, a gate wiring (gate wiring layer) 13g including a gate electrode and a second wiring layer 13a that constitutes a part of the above-described multi-layer interconnection structure, are formed by patterning the gate wiring film 13. As described above, in this example, the concavo-convex form (concavo-convex portion 13A) reflecting the concavo-convex form caused by the opening H1, is provided on the surface of the gate wiring film 13. The gate wiring film 13 and second wiring layer 13a can be patterned in a state of positioning the gate wiring film 13 and second wiring layer 13a with high precision with respect to the underlying semiconductor film 11 by utilizing the concavo-convex portion 13A as an alignment mark.

(Impurity Implantation Process)

Figure 2C:
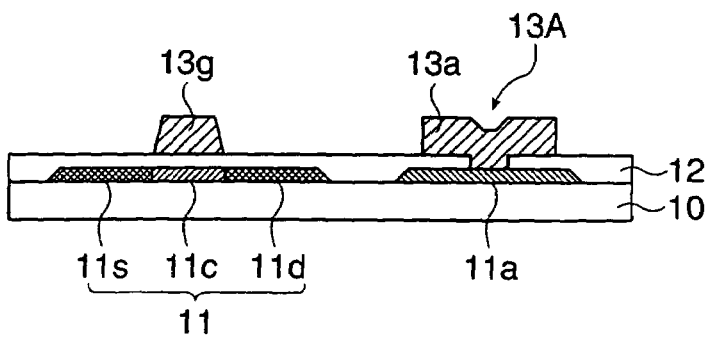

As shown in FIG. 2C, a source region 11s and a drain region 11d are formed in the semiconductor film 11 by implanting an impurity ion with the gate wiring 13g used as a mask. At this point, the gate electrode 13g is used as the mask for ion implantation, and therefore a channel region 11c has a self-aligned structure in which the channel region 11c is formed only under the gate electrode. Two types of impurity ion implantation, that is, an ion doping method in which a hydride of the implanted impurity element and hydrogen are implanted by using a non-mass separation type ion implanter and an ion implantation method in which only a desired impurity element is implanted by using a mass separation type ion implanter can be applied. A hydride of the implanted impurity element such as phosphine ($PH_3$) and diborane ($B_2H_6$) diluted in hydrogen can be used as a source gas of the ion doping method.

(Interlayer Insulation Film Formation Process, Impurity Activation Process)

Figure 2D:
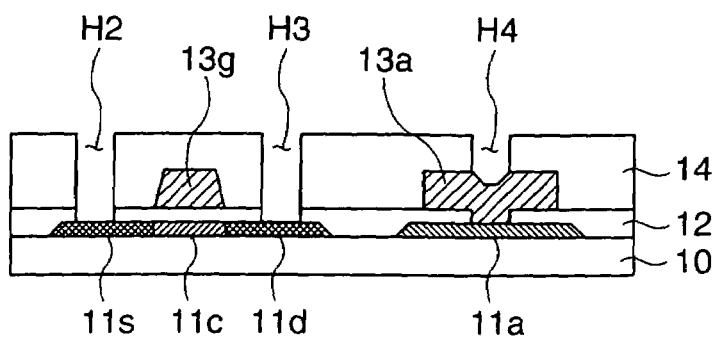

As shown in FIG. 2D, an interlayer insulation film 14 is formed on the whole surface of the substrate so as to cover the gate insulation film 12, the gate wiring 13g, and the second wiring layer 13a. The method of forming the interlayer insulation film 14 is the same as the method of forming the gate insulation film 12. That is, a liquid for application in which polysilazane is mixed in xylen (a liquid material including polysilazane) is applied onto the substrate by spin coating and pre-baked at the temperature of 100 to 150 degrees Celsius for 5 minutes. Heat treatment is then performed in the atmosphere of WET $O_2$ at the temperature of 300 to 400 degrees Celsius for 60 minutes (main baking). Incidentally, although the last heat treatment is performed concurrently with activating an impurity implanted into the semiconductor film 11 in this example, this activating process can be applied subsequent to the above-described impurity implantation process. In this case, there are activation methods such as a method of laser irradiation, a method of heating in a furnace at the temperature of 300 degrees Celsius or more (a low temperature heat treatment method), and a rapid heat treatment method with a lamp. An appropriate method can be selected.

(Contact Hole Formation Process)

Openings (contact holes) H2, H3, and H4 are formed at the locations corresponding to the source portion and drain portion of the interlayer insulation film 14 and gate insulation film, and at the location leading to the second wiring layer 13a, respectively. Although the openings H3 and H4 are formed by using the normal photoetching process in this example, the openings H3 and H4 may be formed by the above-described method with the use of a mask pillar.

(Source Wiring Layer and Drain Wiring Layer Formation Process)

Figure 3A:
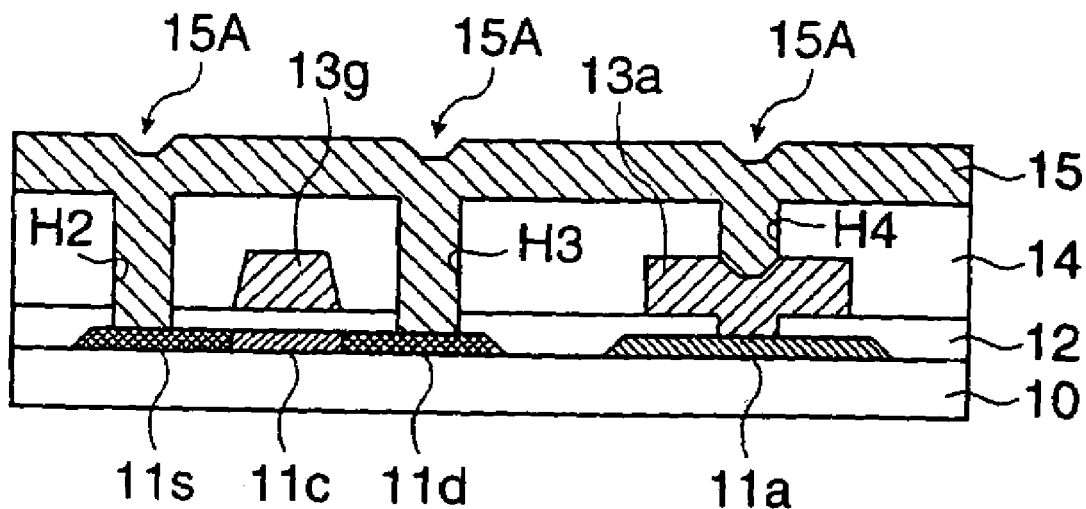
FIGS. 3A-B are schematic process diagrams subsequent to FIG. 2.

As shown in FIG. 3A, a metal film 15 such as an aluminum film, a chrome film, and a tantalum film is formed by a sputter method, a PVD method or the like so as to cover the surface of the interlayer insulation film 14 and the inside of the openings H2, H3, and H4. Although an opaque metal film 15 is formed on the whole surface of the substrate in this process, the openings H2, H3, and H4 have been formed in the interlayer insulation film 14. As a result, concavo-convex portions 15A having the form reflecting the concavo-convex form of the interlayer insulation film 14 are also formed on the surface of the metal film 15.

Figure 3B:
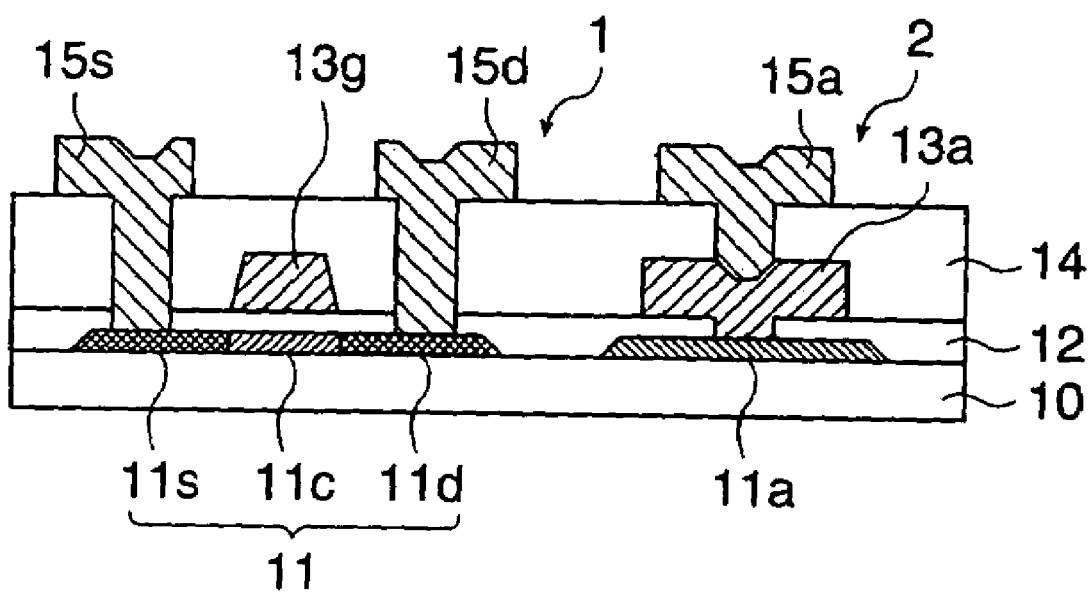

As shown in FIG. 3B, a source wiring (a source wiring layer) 15s including a source electrode, a drain wiring (a drain wiring layer) 15d including a drain electrode, and a third wiring layer 15a of the multi-layer interconnection structure are formed by patterning the metal film 15. As described above, in this example, the concavo-convex forms (concavo-convex portions 15A) reflecting the concavo-convex forms of the underlying openings H2, H3, and H4 are provided on the surface of the metal film 15. The metal film 15 can be patterned in a state of positioning the metal film 15 with high precision with respect to the gate wiring 13g and second wiring layer 13a by utilizing the concavo-convex portions 15A as alignment marks.

Incidentally, silicon oxide, silicon nitride, PSG, etc., can be deposited as necessary on the source electrode 15s, the drain electrode 15d, and the second wiring layer 15a to form a protective film.

The above is the processes in which the multi-layer interconnection structure 2 including the transistor 1, and the first, second, and third wiring layers 11a, 13a, and 15a, is manufactured.

As described above, the present exemplary embodiment expands the region to form the multi-layer interconnection up to the layer (the first-formed layer), which is used in the related art only to form a semiconductor layer of the TFT, that is, the same layer as the layer to form the semiconductor layer 11. Thus, in the present exemplary embodiment, forming the necessary wiring on the first-formed layer makes it possible to substantially reduce the wiring density of the layer that is formed on or above the first-formed layer, which can readily deal with the necessity of higher integration if it becomes necessary. Particularly in the present exemplary embodiment, the first wiring layer and semiconductor layer are connected directly instead of via the layer formed on or above the first-formed layer, and therefore the wiring density of the layer formed on or above the first-formed layer can be reduced.

The method of manufacturing the semiconductor device of the present exemplary embodiment adopts a liquid phase process in part of the manufacturing processes, and therefore a very planar surface of a film can be obtained. There is therefore no concern that disconnection or the like due to a difference in level occurs in the formation of wiring. As a result, manufacturing a transistor with high reliability in the high yield ratio is possible. In the present exemplary embodiment, before forming the conductive film on the insulation film (in this example, the gate insulation film 12 and the interlayer insulation film 14) formed by the liquid phase process, the openings are formed in the insulation film, and thus the concavo-convex form is provided on the surface of the conductive film. Consequently, the conductive film can be patterned in a state of positioning the conductive film with high precision with respect to the semiconductor film and the wiring layer located at the side of the lower layer. Particularly in this method, the process of opening a hole in the insulation film is not a new process to be added and need not specially secure the area for forming the alignment mark on the substrate, because this process is applied as a part of the process of forming a contact hole.

In the present exemplary embodiment, the wiring layer of the multi-layer interconnection structure 2 is formed concurrently with the layer of constituting the TFT 1 (such as the gate wiring layer, the source wiring layer, and the drain wiring layer), and therefore a new process is never added for forming such wiring layers.

Incidentally, although the example that the TFT 1 is provided with one multi-layer interconnection structure 2 is shown in the present exemplary embodiment, the plurality of multi-layer interconnection structures may also be provided for the TFT 1.

[Electronic Apparatus]

An electronic apparatus of exemplary embodiment of the present invention will now be described.

Figure 4:
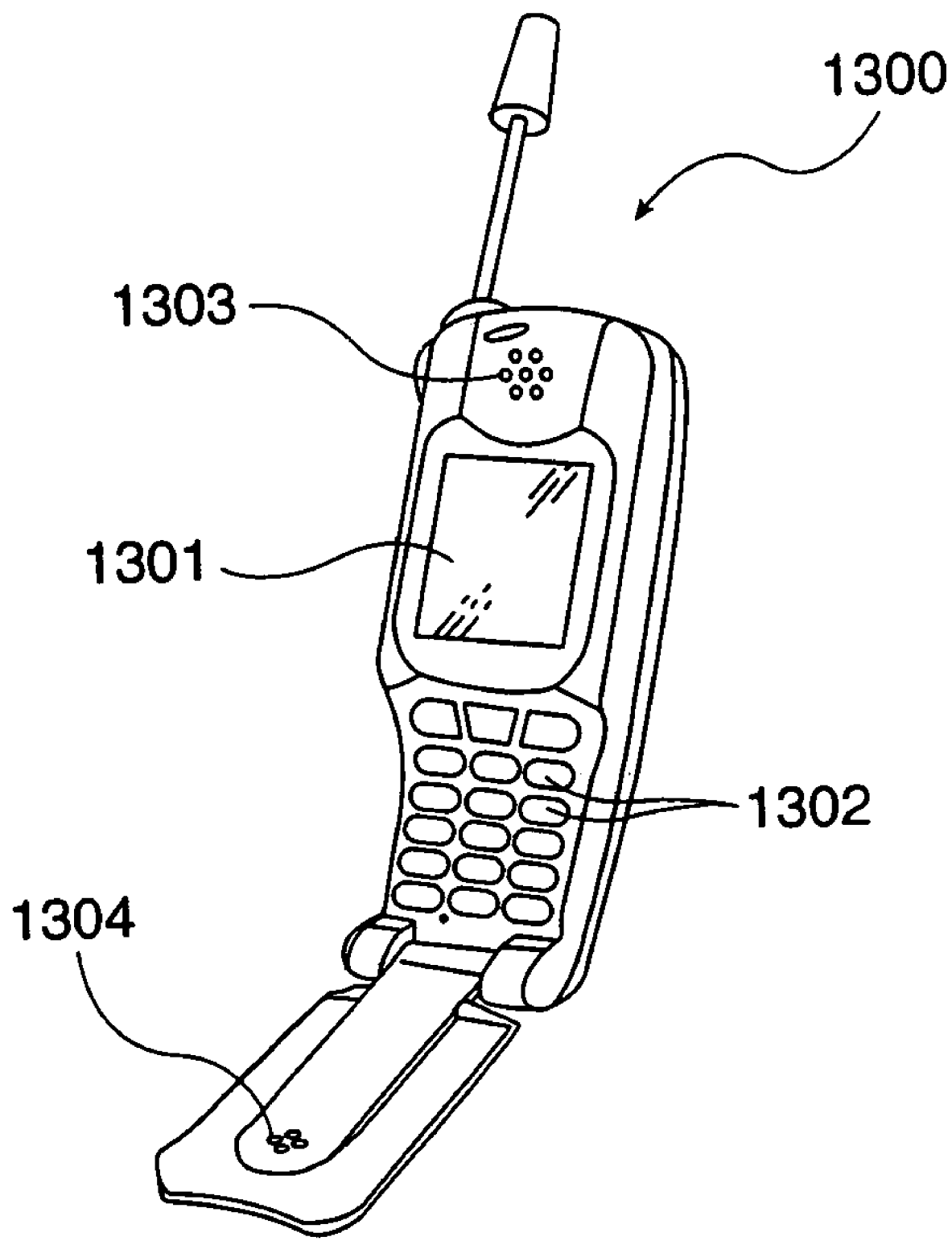
FIG. 4 is a schematic perspective view showing an example of an electronic apparatus of exemplary embodiments of the present invention.

FIG. 4 is a schematic perspective view showing an example of an electronic apparatus according to exemplary embodiments of the present invention. A cellular phone 1300 shown in the drawing has the semiconductor device manufactured by using the above-described method inside the housing or in a display 1301. Incidentally, in the drawing, a reference numeral 1302 denotes manual operation buttons; 1303, an earpiece; and 1304, a mouthpiece.

The semiconductor device of the above-described exemplary embodiment can be applied not only to the above-described cellular phone but also a variety of electronic apparatuses such as an electronic book, a personal computer, a digital still camera, a liquid crystal television, a viewfinder type or monitor direct-view type video tape recorder, car navigation equipment, a pager, an electronic databook, an electronic calculator, a word processor, a workstation, a videophone, a POS terminal, and devices with a touch panel. In every electronic apparatus, the application of the semiconductor device of exemplary embodiments of the present invention makes it possible to address or achieve the advanced functionality.

The preferred exemplary embodiment according to exemplary embodiments of the present invention has been described above with reference to the accompanying drawings. It will be appreciated that exemplary embodiments of the present invention are not limited to the foregoing exemplary embodiment. Although the order of processes is set, for example, as described above in the foregoing exemplary embodiment, the order of processes is not limited thereto. The order of processes may be appropriately changed. For example, an impurity implantation by using a resist mask or other metal masks may be performed before the formation of the gate wiring film 13.

Although the semiconductor film 11 is polycrystallized in the above-described exemplary embodiment, the semiconductor film in the amorphous state (amorphous silicon film) may be used for the active layer of the transistor. Although both the gate insulation film 12 and the interlayer insulation film 14 are polysilazane baked films, one of the insulation films may be a film other than the polysilazane baked film (such as, a CVD film and a PVD film). Although the example of applying the method of manufacturing the semiconductor device of exemplary embodiments of the present invention to the method of manufacturing the top gate type transistor is given in the above-described exemplary embodiment, exemplary embodiments of the present invention are not limited to the example. Exemplary embodiments of the present invention may be applied to the method of manufacturing the bottom gate type transistor and the method of manufacturing a semiconductor device other than a transistor. Furthermore, the forms and combinations of members indicated in the above-described example are an example and can be variously changed based on the design requests and other requests without departing from the spirit of exemplary embodiments of the present invention.

What is claimed is:

1. A semiconductor device, comprising:

a substrate;

a first semiconductor film positioned over the substrate;

a first wiring positioned over the substrate;

a first insulating layer positioned over the first semiconductor film and the first wiring;

a gate electrode positioned over the first insulating layer, the gate electrode being overlapped with the first semiconductor film;

a second wiring positioned over the first insulating layer, the first wiring being overlapped with the second wiring, the first and second wirings being electrically connected to each other via a first contact hole that is formed in the first insulating layer;

a second insulating layer positioned over the gate electrode and the second wiring; and a third wiring positioned over the second insulating layer, the third wiring overlapped with the second wiring, the second and the third wirings being electrically connected to each other via a second contact hole that is formed in the second insulating layer;

a source electrode positioned over the second insulating layer, the source electrode overlapped with the first semiconductor film, the source electrode and the first semiconductor film being electrically connected to each other via a third contact hole that is formed in the first and second insulating layers; and a drain electrode positioned over the second insulating layer, the drain electrode overlapped with the first semiconductor film, the drain electrode and the first semiconductor film being electrically connected to each other via a fourth contact hole that is formed in the first and the second insulating layers.

2. The semiconductor according to claim 1, the first semiconductor film and the first wiring being positioned on a same layer, the first semiconductor film and the first wiring being separated to each other.

3. The semiconductor according to claim 1, the first wiring being electrically connected to the first semiconductor film.

4. The semiconductor according to claim 1, the first wiring being connected to the first semiconductor film, the first wiring and the first semiconductor film being composed of one semiconductor film.

5. The semiconductor according to claim 1, the first wiring being a second semiconductor film 6. The semiconductor according to claim 1, the first wiring being a second semiconductor film, each of the first and the second semiconductor films being a poly silicon film.

7. The semiconductor according to claim 1, each of the gate electrode and the second wiring being a metal film.

8. The semiconductor according to claim 1, a portion of the first semiconductor film being a channel region of a transistor, the portion being overlapped with the gate electrode.

9. The semiconductor according to claim 1, the first semiconductor film and the gate electrode being a component of a transistor, the first, the second and the third wirings being a component of a multi wiring structure, the multi wiring structure being configured to receive an electrical signal from the transistor.

10. A semiconductor device, comprising:

a substrate;

a first semiconductor film positioned over the substrate;

a first wiring positioned over the substrate, the first wiring being a metal film;

a first insulating layer positioned over the first semiconductor film and the first wiring;

a sate electrode positioned over the first insulating layer, the gate electrode being overlapped with the first semiconductor film;

a second wiring positioned over the first insulating layer, the first wiring being overlapped with the second wiring, the first and second wirings being electrically connected to each other via a first contact hole that is formed in the first insulating layer;

a second insulating layer positioned over the gate electrode and the second wiring; and a third wiring positioned over the second insulating layer, the third wiring overlapped with the second wiring, the second and third wirings being electrically connected to each other via a second contact hole that is formed in the second insulating layer.

11. A semiconductor device, comprising:

a substrate;

a first semiconductor film positioned over the substrate;

a first wiring positioned over the substrate, the first wiring being a metal film that includes aluminum;

a first insulating layer positioned over the first semiconductor film and the first wiring;

a gate electrode positioned over the first insulating layer, the gate electrode being overlapped with the first semiconductor film;

a second wiring positioned over the first insulating layer, the first wiring being overlapped with the second wiring, the first and second wirings being electrically connected to each other via a first contact hole that is formed in the first insulating layer;

a second insulating layer positioned over the sate electrode and the second wiring; and a third wiring positioned over the second insulating layer, the third wiring overlapped with the second wiring, the second and third wirings being electrically connected to each other via a second contact hole that is formed in the second insulating layer.

12. A semiconductor device, comprising:

a substrate;

a first semiconductor film positioned over the substrate;

a first wiring positioned over the substrate;

a first insulating layer positioned over the first semiconductor film and the first wiring;

a gate electrode positioned over the first insulating layer, the gate electrode being overlapped with the first semiconductor film;

a second insulating layer positioned over the gate electrode; and a third wiring positioned over the second insulating layer, the third wiring overlapped with the first wiring, the first and the third wirings being electrically connected to each other via a first and a second contact holes, the first contact hole being formed in the first insulating layer, the second contact hole being formed in the second insulating layer;

a source electrode positioned over the second insulating layer, the source electrode overlapped with the first semiconductor film, the source electrode and the first semiconductor film being electrically connected to each other via a third contact hole that is formed in the first and the second insulating layers; and a drain electrode positioned over the second insulating layer, the drain electrode overlapped with the first semiconductor film, the drain electrode and the first semiconductor film being electrically connected to each other via a fourth contact hole that is formed in the first and the second insulating layers.

* * * * *